United States Patent [19]

Tran

[11] Patent Number: 4,685,086

[45] Date of Patent: Aug. 4, 1987

[54] MEMORY CELL LEAKAGE DETECTION CIRCUIT

[75] Inventor: Hiep V. Tran, Carrollton, Tex.

[73] Assignee: Thomson Components - Mostek Corp., Carrollton, Tex.

[21] Appl. No.: 798,040

[22] Filed: Nov. 14, 1985

[51] Int. Cl.⁴ .............................................. G11C 11/40
[52] U.S. Cl. .................................... 365/203; 365/190; 365/200; 365/201
[58] Field of Search ............... 365/154, 190, 201, 203, 365/200, 156

[56] References Cited

U.S. PATENT DOCUMENTS

| | | | |
|---|---|---|---|
| 4,386,419 | 5/1983 | Yamamoto | 365/190 |
| 4,459,686 | 7/1984 | Toyoda | 365/190 |
| 4,502,140 | 2/1985 | Proebsting | 365/201 |
| 4,507,759 | 3/1985 | Yasui et al. | 365/154 |
| 4,580,245 | 4/1986 | Ziegler et al. | 365/154 |

Primary Examiner—James W. Moffitt
Attorney, Agent, or Firm—Roland Plottel

[57] ABSTRACT

A circuit for detecting a short circuit in a SRAM memory cell (10) includes means for connecting the nodes (21, 23) of the memory cell to the gates of a pair of pulldown transistors (66, 68). The pulldown transistors perform a level-shifting function to produce a voltage pattern that has one high node and one low node (72, 74) for a normal cell and two intermediate voltage nodes for a shorted cell. A following logic circuit (76) responds to the voltage pattern to produce an output voltage that has one value when the cell is functioning correctly and another value when the cell is shorted.

7 Claims, 2 Drawing Figures

MEMORY CELL LEAKAGE DETECTION CIRCUIT

DESCRIPTION

1. Technical Field

The field of the invention is that of static RAM memories, in particular CMOS memories.

2. Background Art

It is known to replace defective memory cells by substituting for a defective cell or the column containing a defective cell a corresponding redundant column. It is also known to isolate a defective cell having a short circuit between the power supply and ground.

DISCLOSURE OF INVENTION

The invention relates to a circuit and method for detecting a particular defect in a static RAM memory cell in which the power supply is shorted to ground. A feature of the invention is the use of an intermediate transfer stage to transfer the voltage on the bit lines to the input terminals of a logic circuit that responds to an intermediate voltage characteristic as a shorted cell.

BEST MODE OF CARRYING OUT THE INVENTION

Among other failure modes of SRAM memory cells, in particular CMOS SRAM memory cells, there is the possibility that there will be a short circuit between the power supply and ground. The most common mechanism for this short circuit is the shorting together of two gates within the cell. In this case, the defective cell will draw DC current from the power supply. It is not sufficient to replace the defective cell with a redundant column or redundant row, it is also necessary to cut the connection between either the power supply or ground line going to that row or column. Preferably, the ground connection is cut because, if the power supply connection were cut, there could still be a short between the bit line going through the memory cell and ground.

If the circuit has redundant elements available, then there must be a way to identify a shorted memory cell, so that it may be replaced. A conventional laser process may be used to perform the replacement operation by destroying one or more fuses connecting the defective row or column and substituting a replacement row or column.

Figure 1:
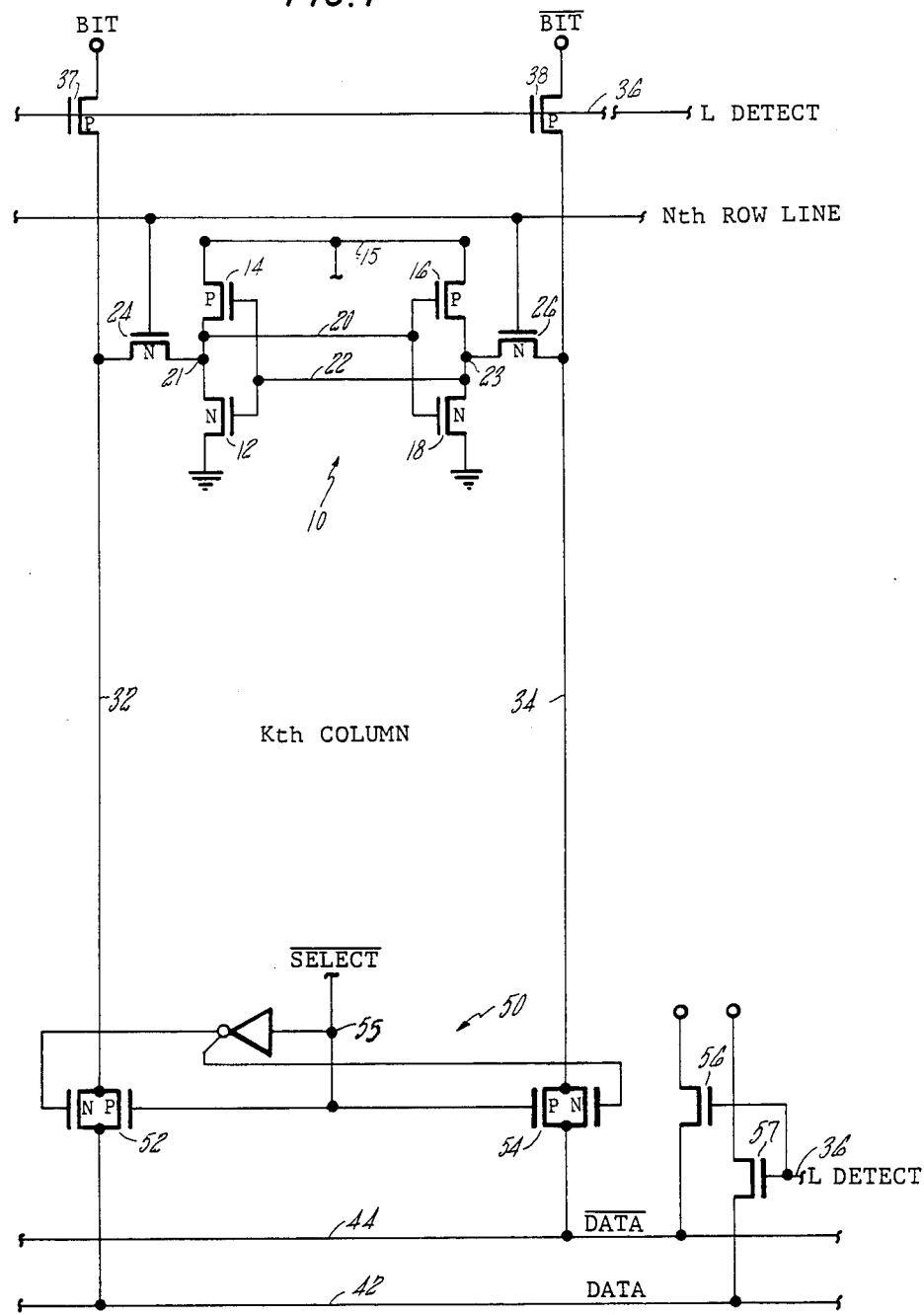
FIG. 1 illustrates a portion of a memory matrix and circuitry for connecting a selected memory cell to a leakage detecting circuit.

Referring now to FIG. 1, there is illustrated a portion of a memory cell array showing the Kth column bounded by bit line 32 and bit line 34 and being connected to the Nth row line. Both lines 32 and 34 are connected to pull up transistors 37 and 38 respectively that are controlled by a leakage detection signal along line 36. These two P-channel pull up transistors may be used to precharge the bit line and $\overline{\text{bit}}$ line to the power supply voltage. At the bottom of the figure, there are a pair of data and $\overline{\text{data}}$ lines 42 and 44, respectively, which are selectively connected to the bit and $\overline{\text{bit}}$ lines for that particular column by a select circuit 50 that comprises a pair of N and P-channel pass transistors 52 and 54 controlled by a select signal on line 55. Another pair of optional pull up P-channel transistors 56 and 57 are controlled by the same leakage detection signal on line 36.

A conventional six transistor static RAM cell 10 is illustrated, having a power supply connection 15 connected to a source of +5 volts, a pair of inverters having N-channel transistor 12, P-channel transistor 14, output node 21 and gate node 22 for the left hand inverter and N-channel transistor 18, P-channel transistor 16, output node 23, input node 20 and output node 22 for the right-hand inverter of a conventional cross-coupled inverter static RAM cell. A pair of N-channel pass transistors 24 and 26 controlled by the ROW line connect the output nodes 21 and 23 to the bit and $\overline{\text{bit}}$ lines respectively. The operation of the static RAM memory cell for READ and WRITE operations is conventional and will not be repeated here.

When it is desired to test for a leaking memory cell, use is made of the fact that, when a memory cell is working properly, the output nodes 21 and 23, referred to as the cell nodes, will be either high or low (+5 volts or ground). When there is a short circuit within the memory cell, the effect will be the same as if an inverter has its output shorted to its input and the output nodes will both assume the same equal intermediate voltage value, the magnitude of which will depend on the ratio of the current capacity of pull up transistors 14 and 16 to that of pull down transistors 12 and 18. In order to detect a memory cell having this particular defect, it is necessary to have a circuit that will respond to the case of both outputs having an equal intermediate value. The magnitude of the voltage value may be set at a desired value by sizing the transistors, as is known in the art.

Figure 2:
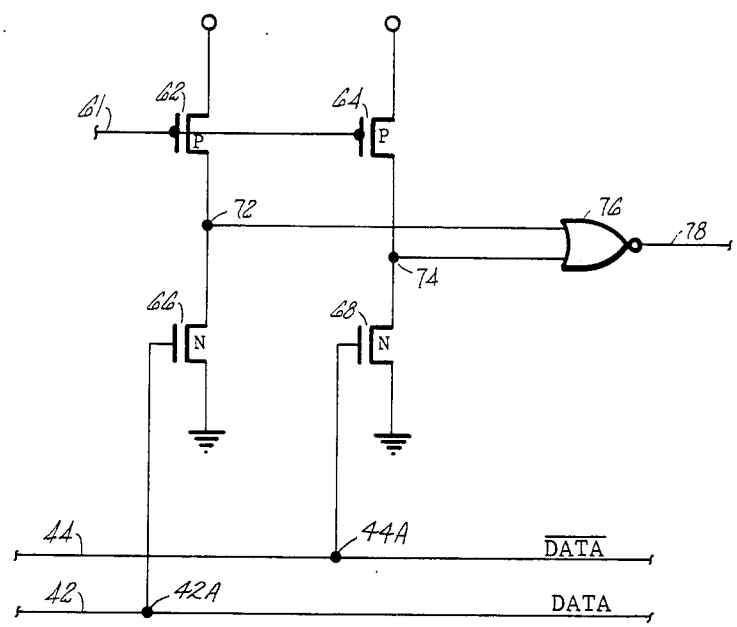
FIG. 2 illustrates a leakage detection circuit according to the invention.

Referring now to FIG. 2, there is shown the same data and $\overline{\text{data}}$ lines, 42 and 44 with input test node 42A and 44A respectively, each of which is now connected to the gate of an N-channel transistor, 66 and 68 respectively, that is in turn connected to a P-channel pull up transistor, 62 and 64 respectively. The P-channel pull up transistors are shown as controlled by line 61 in this drawing. Line 61 may be permanently connected to the power supply or may be connected to a voltage reference circuit, as is convenient. Preferably, line 61 is only energized in a test operation although the test circuit may also be used in conventional operation to signal a flawed output. In the case where line 61 is only energized in a test operation, it may be contacted directly by a test probe or, alternatively, it may be connected to a test control circuit that is activated by a particular combination of voltages on input terminals. In the case where the circuit of FIG. 2 is to be used in operation, line 61 would be controlled by an internal signal, such as the select signal that connects the column lines to the bit line, and the output of this logic unit would be connected to an error signal. Those skilled in the art will readily be able to implement the functions described above.

Nodes intermediate 72 and 74, at the drains of pull down transistors 66 and 68, are the inputs to a conventional NOR circuit 76 having an output 78. In operation, a memory cell is connected to the data and $\overline{\text{data}}$ lines and, in turn, control transistors 66 and 68. If the data cell is functioning properly, one transistor will be on and the other off. The two nodes 72 and 74 will then have one high value and one low value and the output 78 of NOR gate 76 will be low. In the case where the memeory cell has a short circuit to ground, both the data and $\overline{\text{data}}$ lines will have the intermediate cell voltage value that is assumed to be greater than the N-channel threshold value of the transistor 66 and 68 in the level shifting circuit and preferably greater than the N-channel saturation voltage. This can be conventionally done, as is known to those skilled in the art, by sizing the ratios of P-channel transistors to N-channel transistors within the memory cell. In that case, both transistors 66 and 68 will be turned on by the output from a shorted cell and both intermediate nodes 72 and 74 will have substantially the same voltage, which will be determined by the ratios of the current capacities of transistors 62 and 66 and 64 and 68. These voltages are referred to as corresponding logic one, logic zero and intermediate voltages. These ratios must be set so that the voltage on both nodes 72 and 74 is below the trip point of NOR gate 76. NOR gate 76 thus treats the shorted cell as though it contained two nodes at zero volts. If there is a different kind of short, such as between one of the cell nodes and the power supply or one of the cell nodes and ground, so that one or both of the cell nodes is a hard supply voltage or hard ground, the NOR gate will still give the correct result. Thus, when there is a short circuit in the cell, output 78 will change state from a normally low voltage to a high voltage. An AND or NAND gate could also be used instead of the NOR gate, with the trip point being set below the intermediate voltage value. The normally operating cells would not satisfy the condition and the shorted cell would. For purposes of this specification, the terminology is used that the trip point voltage is "related to" the intermediate voltage, by which it is meant that the trip point voltage is above the intermediate voltage when the logic circuit is a NOR or OR gate and is below the intermediate voltage when the logic circuit is a NAND or AND gate.

Those skilled in the art will be able to apply the principles of the invention to circuits where the logic levels are logic low instead of high; to circuits that employ N-channel or P-channel technology instead of the CMOS technology illustrated, and to circuits that employ other logic circuits in place of NOR gate 76. For example, OR, AND, NAND exclusive —OR and —NOR circuits may be used, with additional inverters if necessary. Also, NOR gate 76 may have a conventional trip point, as illustrated, or the trip point of the logic unit it may be adjusted by sizing the transistors in the input to accommodate a different voltage on intermediate nodes 72 and 74 that may be easier to produce.

What I claim is:

1. In an integrated circuit SRAM memory, the combination comprising:
   a memory array of static memory cells having first and second cell nodes, said cell nodes carrying a logic one voltage and a logic zero voltage when operating correctly and an intermediate voltage when short-circuited;
   means for connecting each of said first and second cell nodes to corresponding first and second input test nodes;
   first and second pullup transistors connected between a power supply terminal and corresponding first and second intermediate nodes;
   a first pulldown transistor connected between said first intermediate node and ground having a first gate connected to said first input test node;
   a second pulldown transistor connected between said second intermediate node and ground and having a second gate connected to said second input test node;
   means for activating said first and second pullup transistors, thereby establishing first and second current paths from said power supply terminal to ground through said first and second intermediate nodes, respectively, each of said first and second current paths carrying a current dependent on the voltage state of said first and second cell nodes, whereby said first and second intermediate nodes carry a corresponding logic one voltage and a corresponding logic zero voltage when said memory cell is operating correctly and a corresponding intermediate voltage when said memory cell is short-circuited; and
   a logic circuit having first and second inputs connected to said first and second intermediate nodes respectively and an output having first and second output voltage states, which logic circuit is responsive to input states having identical or different voltage states and has an input trip point for each of said first and second inputs that is related to said corresponding intermediate voltage, whereby a normally operating memory cell places said corresponding logic zero voltage on one of said inputs and said corresponding logic one voltage on the other of said inputs to produce said first output voltage state and a short-circuited cell places said corresponding intermediate voltage on both of said inputs to produce said second output voltage state.

2. The combination according to claim 1, in which said logic circuit is selected from the class comprising a NOR gate and an OR gate, and said input trip point is further from a logic zero voltage than is said intermediate voltage, whereby said logic circuit responds to said intermediate voltage as it does to said logic zero voltage.

3. The combination according to claim 1, in which said logic circuit is selected from the class comprising a NAND and an AND gate, and said input trip point is closer to said logic zero voltage than is said intermediate voltage, whereby said logic circuit responds to said intermediate voltage as it does to said logic one voltage.

4. The combination according to claim 1, in which said means for activating said first and second pullup transistors comprises switchable means for activating said first and second pullup transistors when data is present on said first and second data lines that are part of said means for connecting each of said first and second cell nodes to said first and second input test nodes.

5. The combination according to claim 1, in which said static memory cells comprise cross-coupled inverters having cell pullup transistors and cell pulldown transistors, connected to said cell pullup transistors at said first and second cell nodes and being sized to produce predetermined logic one voltages and logic zero voltages when operating correctly and a predetermined intermediate voltage when said first and second cell nodes are shorted together.

6. The combination according to claim 1, in which said input trip point of said logic circuit has a standard value characteristic of logic circuits within said integrated circuit and said first and second pullup and pulldown transistors have predetermined current capacities selected such that, when said first and second pullup transistors are energized and said first and second pulldown transistors are turned on by said intermediate voltage, said corresponding intermediate voltage is reliably greater than said trip point.

7. The combination according to claim 1, in which said input trip point of said logic circuit has a standard value characteristic of logic circuits within said integrated circuit and said first and second pullup and pulldown transistors have predetermined current capacities selected such that, when said first and second pullup transistors are energized and said first and second pulldown transistors are turned on by said intermediate voltage, said corresponding intermediate voltage is reliably less than said trip point.

* * * * *